United States Patent
Lee et al.

(10) Patent No.: US 8,421,201 B2
(45) Date of Patent: Apr. 16, 2013

(54) INTEGRATED CIRCUIT PACKAGING SYSTEM WITH UNDERFILL AND METHODS OF MANUFACTURE THEREOF

(75) Inventors: KyungHoon Lee, Icheon (KR); DaeWook Yang, Pyoungtaek-si (KR); SunMi Kim, Gyangju-si (KR)

(73) Assignee: STATS Chippac Ltd., Singapore (SG)

( * ) Notice: Subject to any disclaimer, the term of this patent is extended or adjusted under 35 U.S.C. 154(b) by 204 days.

(21) Appl. No.: 12/489,122

(22) Filed: Jun. 22, 2009

(65) Prior Publication Data

US 2010/0320587 A1  Dec. 23, 2010

(51) Int. Cl.
- *H01L 23/48* (2006.01)
- *H01L 23/02* (2006.01)
- *H01L 29/40* (2006.01)

(52) U.S. Cl.
USPC ............... 257/686; 257/276; 257/777

(58) Field of Classification Search ........... 257/276.686, 257/777
See application file for complete search history.

(56) References Cited

U.S. PATENT DOCUMENTS

| | | | |
|---|---|---|---|
| 5,831,832 A * | 11/1998 | Gillette et al. | 361/760 |
| 5,942,798 A | 8/1999 | Chiu | |
| 6,011,301 A * | 1/2000 | Chiu | 257/678 |
| 6,214,643 B1 * | 4/2001 | Chiu | 438/108 |
| 6,228,679 B1 | 5/2001 | Chiu | |
| 6,391,683 B1 * | 5/2002 | Chiu et al. | 438/108 |
| 6,940,182 B2 * | 9/2005 | Hilton et al. | 257/787 |
| 6,977,338 B1 * | 12/2005 | Muro et al. | 174/524 |
| 7,179,683 B2 * | 2/2007 | Low et al. | 438/108 |
| 7,339,278 B2 * | 3/2008 | Iksan et al. | 257/778 |
| 7,413,927 B1 * | 8/2008 | Patwardhan et al. | 438/108 |
| 2001/0039110 A1 * | 11/2001 | Nakamura | 438/613 |
| 2005/0151269 A1 * | 7/2005 | Song et al. | 257/778 |
| 2006/0175697 A1 * | 8/2006 | Kurosawa et al. | 257/686 |
| 2006/0197203 A1 | 9/2006 | Chu et al. | |
| 2006/0220195 A1 | 10/2006 | Sane | |
| 2007/0007639 A1 * | 1/2007 | Fukazawa | 257/686 |
| 2007/0269931 A1 * | 11/2007 | Chung et al. | 438/109 |
| 2010/0140809 A1 * | 6/2010 | Chow et al. | 257/777 |
| 2010/0301460 A1 * | 12/2010 | Zhang et al. | 257/622 |

FOREIGN PATENT DOCUMENTS

| JP | 20042660161 | * | 9/2004 |
|---|---|---|---|
| JP | 2007189005 | * | 7/2007 |

* cited by examiner

*Primary Examiner* — James Mitchell
(74) *Attorney, Agent, or Firm* — Ishimaru & Associates LLP

(57) ABSTRACT

A method of manufacture of an integrated circuit packaging system includes: providing a device having a conductor with ends exposed on opposite sides of the device; forming a first surface depression on the device around the conductor; connecting a first component over the conductor and surrounded by the first surface depression; and applying a first underfill between the first component and the device, the first underfill substantially filled within a perimeter of the first surface depression.

16 Claims, 8 Drawing Sheets

FIG. 5
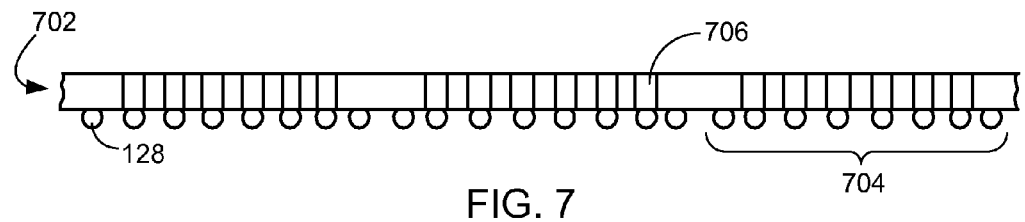
FIG. 7
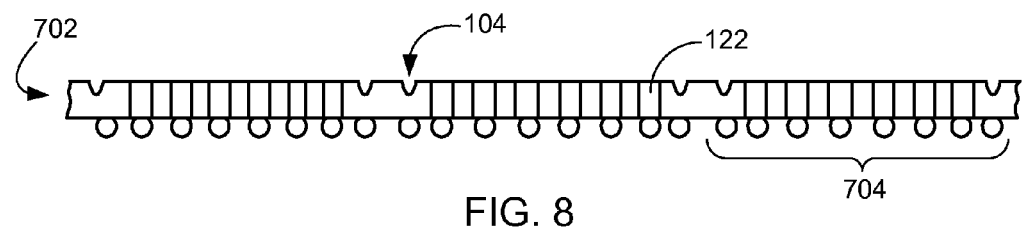
FIG. 8
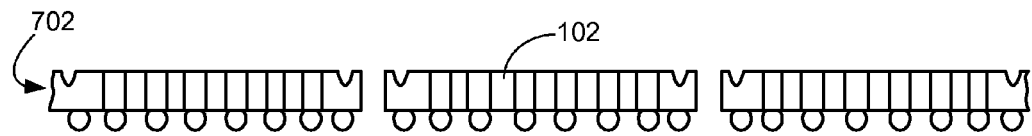
FIG. 9
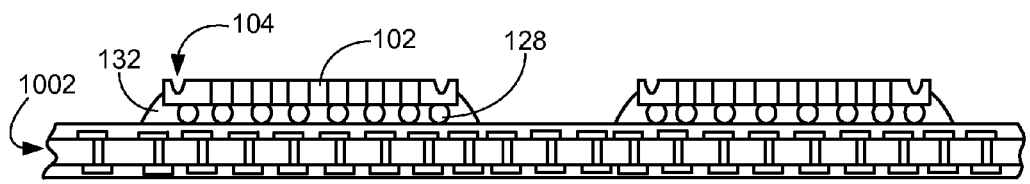
FIG. 10
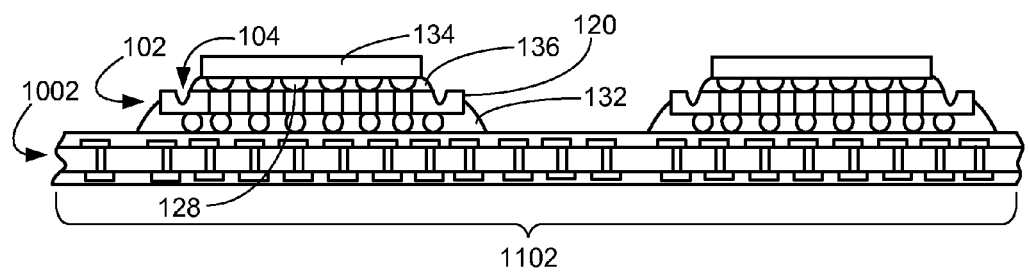
FIG. 11

INTEGRATED CIRCUIT PACKAGING SYSTEM WITH UNDERFILL AND METHODS OF MANUFACTURE THEREOF

TECHNICAL FIELD

The present invention relates generally to an integrated circuit packaging system, and more particularly to a system for an integrated circuit package with underfill.

BACKGROUND ART

The demand for high density and high output/input integrated circuit packages dramatically increased with the trend of electronic products toward lightweight, small size, multi-function, and high speed. Therefore, components in the package are becoming thinner and thinner to reduce the size of the whole package effectively. Electronic products such as cell phone base products, global positioning systems (GPS), satellites, communication equipment, consumer products, and a vast line of other similar products are in ever increasing global demand.

A small product, such as a cell phone, can contain many integrated circuit packages, each having different sizes and shapes. Each of the integrated circuit packages within the cell phone can contain large amounts of complex circuitry. The circuitry within each of the integrated circuit packages work and communicate with other circuitry of other integrated circuit packages and electrical parts using electrical connections on circuit boards.

Products must compete in world markets and attract many consumers or buyers in order to be successful. It is very important for products to continue to improve in features, performance, and reliability while reducing product costs, product size, and equally important to be available quickly for purchase by the consumers or buyers.

Time to market, reliability, the number of integrated circuit packages, and the number of electrical parts on the circuit boards inside a product are important to improving the features, performance, and reliability of any product. Furthermore, the ways the circuitry and electrical connections are implemented have a direct impact on the availability, reliability, and costs of products.

Attempts have failed to provide a complete solution addressing simplified manufacturing processing, time to market, reliability, reduction of electrical parts on the circuit boards, size reductions of the circuit boards and the integrated circuit packages, with increased functionality, leveragability, and increased product features to the consumer.

Thus, a need remains for improvements with the integrated circuit packaging system for the world markets. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a device having a conductor with ends exposed on opposite sides of the device; forming a first surface depression on the device around the conductor; connecting a first component over the conductor and surrounded by the first surface depression; and applying a first underfill between the first component and the device, the first underfill substantially filled within a perimeter of the first surface depression.

The present invention provides an integrated circuit packaging system including: a device having a conductor with ends on opposite sides of the device; a first surface depression formed on the device around the conductor; a first component connected over the conductor surrounded by the first surface depression and; a first underfill between the first component and the device, the first underfill substantially filled within a perimeter of the first surface depression.

Certain embodiments of the invention have other steps or elements in addition to or in place of those mentioned above. The steps or elements will become apparent to those skilled in the art from a reading of the following detailed description when taken with reference to the accompanying drawings.

BRIEF DESCRIPTION OF THE DRAWINGS

FIG. 7 is a cross-sectional view of a wafer in a planarizing phase of the integrated circuit packaging system.

FIG. 8 is the structure of FIG. 7 in a forming phase of the first surface depression.

FIG. 9 is the structure of FIG. 8 in a singulation phase of the wafer.

FIG. 10 is a portion of the structure of FIG. 9 in a base fill phase.

FIG. 11 is the structure of FIG. 10 in a component fill phase.

BEST MODE FOR CARRYING OUT THE INVENTION

Figure 1:
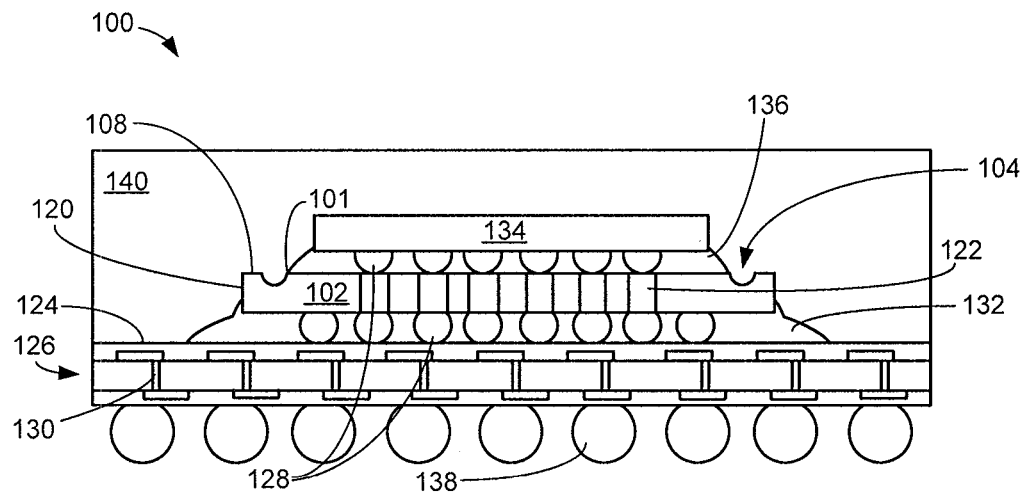
FIG. 1 is a cross-sectional view of an integrated circuit packaging system in a first embodiment of the present invention taken along a line 1-1 of FIG. 2.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
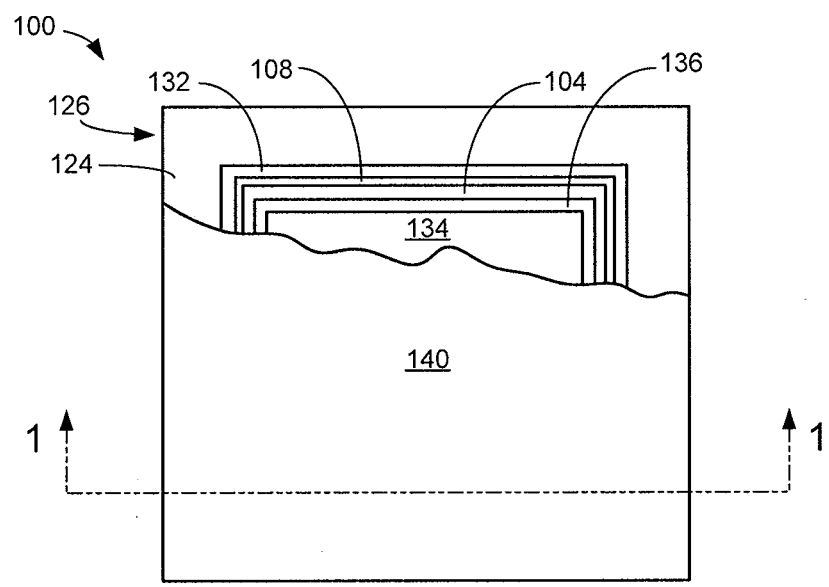
FIG. 2 is a top view of the integrated circuit packaging system.

Referring now to FIG. 1, therein is shown a cross-sectional view of an integrated circuit packaging system 100 in a first embodiment of the present invention taken along a line 1-1 of FIG. 2. The integrated circuit packaging system 100 can preferably include a device 102 such as die with a through silicon via (TSV), a TSV flip-chip, a stack package, an interposer with circuitry, or an integrated circuit assembly. The device 102 can have a thickness less than 70 micrometers.

The device 102 can include a first surface depression 104, such as a surface ditch, a surface groove, a surface channel, or similar surface indentation, adjacent or in a stack side 108 and along non-horizontal sides 120 of the device 102. The cross-section of the first surface depression 104 is shown having a semi-circular shape. The cross-section of the first surface depression 104 can have any cross-sectional shape.

The first surface depression 104 surrounds an area of the stack side 108 having an end of conductors 122 such as contacts, pads, TSVs, pins, posts, or columns exposed at the stack side 108. The first surface depression 104 can be formed using processes such as water-jet guided laser etching, laser grooving, or laser marking.

For illustrative purposes, the present invention is shown and described as having one of the first surface depression 104 adjacent or in the stack side 108. The present invention can have any number of the first surface depression 104, each non-overlapping with different positions, depths, sizes, or shapes. For example, the stack side 108 could have a square shaped surface depression formed between a smaller rectangular shaped surface depression and a larger circular shaped surface depression.

An end of the conductors 122 opposite the end of the conductors 122 exposed at the stack side 108 can be at an active side of the device 102 opposite and facing away from the stack side 108. The first surface depression 104 surrounds and encloses the conductors 122 exposed at the stack side 108 and the active side 109. The conductors 122 can provide connectivity between the active side of the device 102, the stack side 108, or circuitry within the device 102.

The active side of the device 102 can be mounted over a circuitry side 124 of a package substrate 126. Internal connectors 128 such as balls, bumps, pins, posts, leads, or pillars, can connect the end of the conductors 122 exposed at the active side of the device 102 or the active side of the device 102 with conductive material 130 adjacent the circuitry side 124.

The package substrate 126 includes the conductive material 130 adjacent the circuitry side 124, a side opposite the circuitry side 124 of the package substrate 126, and imbedded within the package substrate 126. The conductive material 130 can provide connectivity between the circuitry side 124 and the side opposite the circuitry side 124 of the package substrate 126.

A base underfill 132 can be used to surround the internal connectors 128 between the active side of the device 102 and the circuitry side 124 of the package substrate 126. The base underfill 132 can cover the active side of the device 102 and substantially fill an area or space between the active side of the device 102 and the package substrate 126. The base underfill 132 can cover part or all of the first surface depression 104. During fabrication of the present invention, the first surface depression 104 can prevent the base underfill 132 from entering any area within a perimeter formed by the first surface depression 104.

An active side of a first component 134 having circuitry can be connected to the end of the conductors 122 exposed at the stack side 108 of the device 102 using the internal connectors 128. A first underfill 136 can be used to surround the active side of the first component 134 and the internal connectors 128 between the active side of the first component 134 and the stack side 108 of the device 102.

The first underfill 136 can be in direct contact with and cover the active side of the first component 134 and the area of the stack side 108. The first underfill 136 can contact an inner edge 101 of the first surface depression isolated from the conductors 122. The first underfill 136 can substantially fill an area or space between the active side of the first component 134 and the area of the stack side 108 to the inner edge 101 closest to the conductors 122. During the fabrication of the present invention, the first surface depression 104 can be used to confine the first underfill 136 within and above the perimeter formed by the first surface depression 104.

It has been discovered that the present invention can provide significantly improved product yields with minimal impact to production costs. Standard laser based manufacturing equipment can be used to form the first surface depression 104 and provide improved product yields due to reduced fill overflow incidents. Thus, the present invention provides a combination of increased yields without significant additional investment such as new equipment, additional personnel, new fabrication processes, or additional employee training.

It has also been discovered, the present invention can effectively minimize thermal stress of an assembly. The first surface depression 104 can be formed having any shape and placement around the active side of the first component 134. The shape and placement of the first surface depression 104 can be used to limit or expand coverage of the first underfill 136. Controlling the coverage of the first underfill 136 can be used to improve the thermal performance characteristics between the first component 134 and the first underfill 136.

System connectors 138 can be used to connect the conductive material 130 adjacent the side opposite the circuitry side 124 with a next level of packaging such as a system substrate, a system board, or an integrated circuit packaging assembly. The system connectors 138 can be similar to the internal connectors 128 except the system connectors 138 can be different in size or shape. An encapsulant 140 can be used to cover or protect the circuitry side 124 of the package substrate 126, the device 102, and the first component 134.

Referring now to FIG. 2, therein is shown a top view of the integrated circuit packaging system 100. For purposes of illustration, a portion of the encapsulant 140 has been removed for clarity. The first component 134 is shown above the first surface depression 104 adjacent or in the stack side 108 and surrounded by the first underfill 136.

The stack side 108 is shown above the circuitry side 124 of the package substrate 126 and surrounded by the base underfill 132. For purposes of illustration, the integrated circuit packaging system 100 is shown having a square shape. The integrated circuit packaging system 100 can have any shape. For example, the integrated circuit packaging system 100 can have any rectangular shape.

Figure 3:
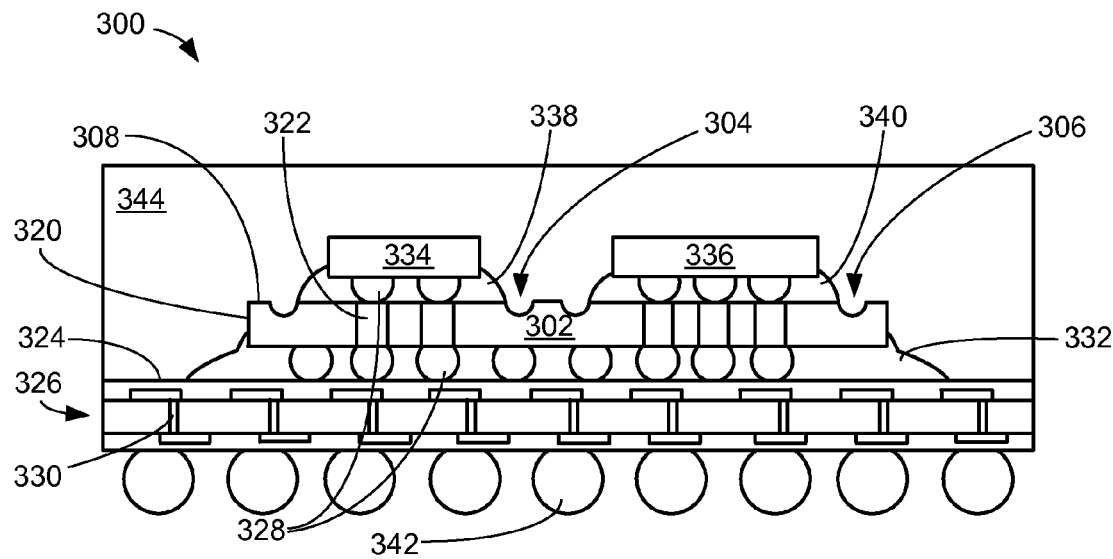
FIG. 3 is a cross-sectional view of an integrated circuit packaging system in a second embodiment of the present invention taken along a line 3-3 of FIG. 4.
Figure 4:
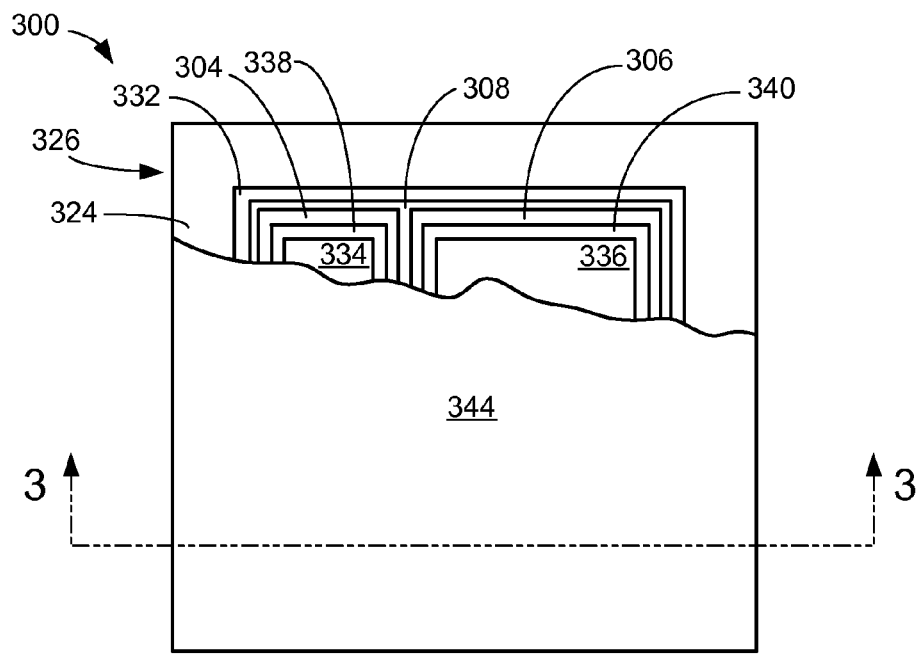
FIG. 4 is a top view of the integrated circuit packaging system.

Referring now to FIG. 3, therein is shown a cross-sectional view of an integrated circuit packaging system 300 in a second embodiment of the present invention taken along a line 3-3 of FIG. 4. The integrated circuit packaging system 300 can preferably include a device 302 such as through silicon via (TSV) die, a TSV flip-chip, a stack package, an interposer with circuitry, or an integrated circuit assembly. The device 302 can have a thickness less than 70 micrometers.

The device 302 can include a first surface depression 304 next to a second surface depression 306. The first surface depression 304, such as a surface ditch, a surface groove, a surface channel, or similar surface indentation, adjacent a stack side 308 of the device 302 and having an offset away from a plane formed bisecting a length of the stack side 308 and perpendicular to the stack side 308.

The second surface depression 306, similar to the first surface depression 304, can be opposite the first surface depression 304 adjacent or in the stack side 308. A perimeter of the second surface depression 306 can be greater than a perimeter of the first surface depression 304.

The cross-section of the first surface depression 304 and the second surface depression 306 are shown having a semi-circular shape. The cross-section of the first surface depression 304 or the second surface depression 306 can have any cross-sectional shape.

A perimeter side of the first surface depression 304 can be next to a perimeter side of the second surface depression 306. Other remaining perimeter sides of the first surface depression 304 and other remaining perimeter sides of the second surface depression 306 can be along non-horizontal sides 320 of the device 302.

The first surface depression 304 surrounds an area of the stack side 308 having an end of conductors 322 such as contacts, pads, TSVs, pins, posts, or columns exposed at the stack side 308. The second surface depression 306 surrounds an area of the stack side 308 having the end of the conductors 322 exposed at the stack side 308.

The first surface depression 304 or the second surface depression 306 can be formed using processes such as waterjet guided laser etching, laser grooving, or laser marking.

An end of the conductors 322 opposite the end of the conductors 322 exposed at the stack side 308 can be adjacent an active side of the device 302 opposite the stack side 308. The conductors 322 can provide connectivity between the active side of the device 302, the stack side 308, or circuitry within the device 302.

The active side of the device 302 can be mounted over a circuitry side 324 of a package substrate 326. Internal connectors 328 such as balls, bumps, pins, posts, leads, or pillars, can connect the end of the conductors 322 exposed at the active side of the device 302 or the active side of the device 302 with conductive material 330 adjacent the circuitry side 324.

The package substrate 326 includes the conductive material 330 adjacent the circuitry side 324, a side opposite the circuitry side 324 of the package substrate 326, and imbedded within the package substrate 326. The conductive material 330 can provide connectivity between the circuitry side 324 and the side opposite the circuitry side 324 of the package substrate 326.

A base underfill 332 can be used to surround the internal connectors 328 between the active side of the device 302 and the circuitry side 324 of the package substrate 326. The base underfill 332 can cover the active side of the device 302 and substantially fill an area or space below the active side of the device 302. The base underfill 332 can cover part or all of the first surface depression 304 or the second surface depression 306.

During fabrication of the present invention, the first surface depression 304 or the second surface depression 306 can prevent the base underfill 332 from entering any area within the perimeter formed by the first surface depression 304 or the second surface depression 306.

An active side of a first component 334 having circuitry can be connected to the end of the conductors 322 exposed at the stack side 308 within the perimeter formed by the first surface depression 304 of the device 302 using the internal connectors 328. An active side of a second component 336 having circuitry can be connected to the end of the conductors 322 exposed at the stack side 308 within the perimeter formed by the second surface depression 306 of the device 302 using the internal connectors 328.

A first underfill 338 can be used to surround the internal connectors 328 between the active side of the first component 334 and the stack side 308 of the device 302. The first underfill 338 can cover the active side of the first component 334 and the area of the stack side 308 within the perimeter formed by the first surface depression 304. The first underfill 338 can substantially fill an area or space between the active side of the first component 334 and the area of the stack side 308 within the perimeter formed by the first surface depression 304.

A second underfill 340 can be used to surround the internal connectors 328 between the active side of the second component 336 and the stack side 308 of the device 302. The second underfill 340 can cover the active side of the second component 336 and the area of the stack side 308 within the perimeter formed by the second surface depression 306. The second underfill 340 can substantially fill an area or space between the active side of the second component 336 and the area of the stack side 308 within the perimeter formed by the second surface depression 306.

During the fabrication of the present invention, the first surface depression 304 can be used to confine the first underfill 338 in the area within the perimeter formed by the first surface depression 304. Similarly, the second surface depression 306 can be used to confine the second underfill 340 in the area within the perimeter formed by the second surface depression 306.

System connectors 342 can be used to connect the conductive material 330 adjacent the side opposite the circuitry side 324 with a next level of packaging such as a system substrate, a system board, or an integrated circuit packaging assembly. The system connectors 342 can be similar to the internal connectors 328 except the system connectors 342 can be different in size or shape.

An encapsulant 344 can be used to cover or protect the circuitry side 324 of the package substrate 326, the device 302, the first component 334, and the second component 336.

Referring now to FIG. 4, therein is shown a top view of the integrated circuit packaging system 300. For purposes of illustration, a portion of the encapsulant 344 has been removed for clarity. The first component 334 is shown above the first surface depression 304 adjacent the stack side 308 and surrounded by the first underfill 338.

The second component 336, adjacent the first component 334, is shown above the second surface depression 306 adjacent the stack side 308 and surrounded by the second underfill 340. The stack side 308 is shown above the circuitry side 324 of the package substrate 326 and between the first surface depression 304 and the second surface depression 306. The stack side 308 can be surrounded by the base underfill 332.

Figure 5:
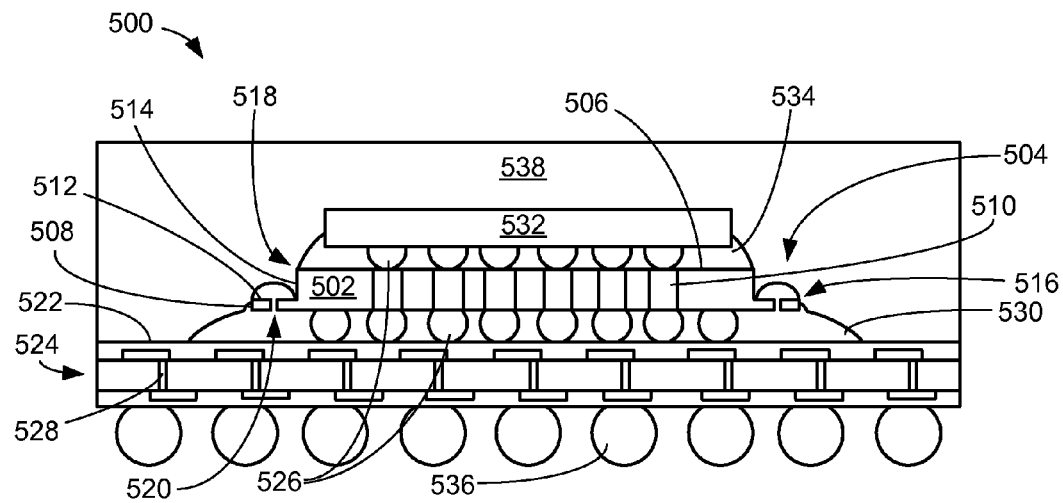
FIG. 5 is a cross-sectional view of an integrated circuit packaging system in a third embodiment of the present invention taken along a line 5-5 of FIG. 6.
Figure 6:
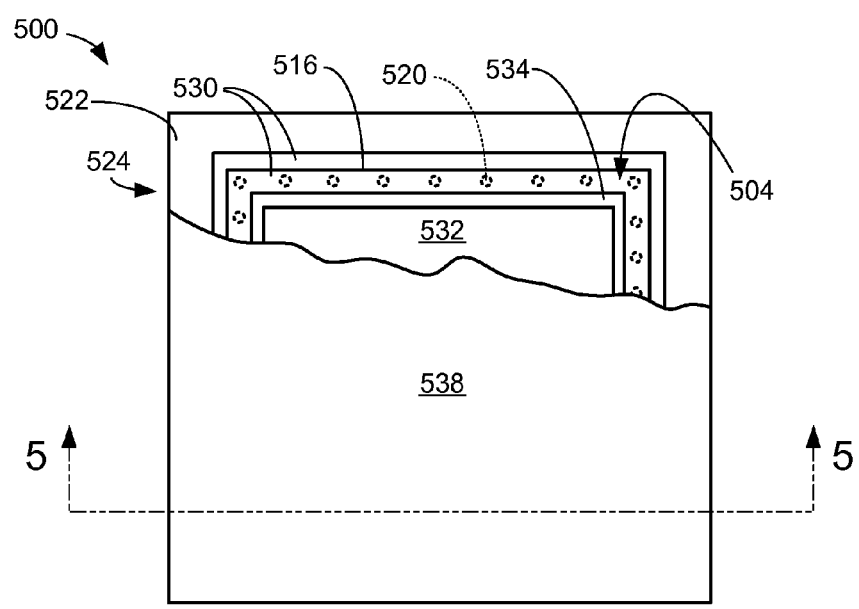
FIG. 6 is a top view of the integrated circuit packaging system.

Referring now to FIG. 5, therein is shown cross-sectional view of an integrated circuit packaging system 500 in a third embodiment of the present invention taken along a line 5-5 of FIG. 6. The integrated circuit packaging system 500 can preferably include a device 502 such as through silicon via (TSV) die, a TSV flip-chip, a stack package, an interposer with circuitry, or an integrated circuit assembly. The device 502 can have a thickness less than 70 micrometers.

The device 502 can include a first surface depression 504, such as a surface ditch, a surface groove, a surface channel, or similar surface indentation, adjacent a stack side 506 and over non-horizontal sides 508 of the device 502. The first surface depression 504 surrounds an area of the stack side 506 having an end of conductors 510 such as contacts, pads, TSVs, pins, posts, or columns exposed at the stack side 506.

The first surface depression 504 can include a horizontal side 512 and a vertical side 514. The horizontal side 512 can be located between the stack side 506 and the active side of the device 502. The horizontal side 512 can optionally be parallel with the stack side 506. The horizontal side 512 can extend away from a top edge 516 of the non-horizontal sides 508 towards the conductors 510.

The vertical side 514 can intersect and join a stack edge 518 of the stack side 506 with the horizontal side 512. The vertical side 514 can optionally be perpendicular with the horizontal side 512. The first surface depression 504 can be formed using processes such as water-jet guided laser etching, laser grooving, or laser marking.

Openings 520, such as a through holes, passages, a tunnels, or similar through openings, can be formed within the first surface depression 504 through the horizontal side 512, the device 502, and the active side. The openings 520 can surround the area having the conductors 510.

There can be any quantity of the openings 520 having any position, width, or size within the first surface depression 504. An end of the conductors 510 opposite the end of the conductors 510 exposed at the stack side 506 can be adjacent an active side of the device 502 opposite the stack side 506. The conductors 510 can provide connectivity between the active side of the device 502, the stack side 506, or circuitry within the device 502.

The active side of the device 502 can be mounted over a circuitry side 522 of a package substrate 524. Internal connectors 526 such as balls, bumps, pins, posts, leads, or pillars, can connect the end of the conductors 510 exposed at the active side of the device 502 or the active side of the device 502 with conductive material 528 adjacent the circuitry side 522.

The package substrate 524 includes the conductive material 528 adjacent the circuitry side 522, a side opposite the circuitry side 522 of the package substrate 524, and imbedded within the package substrate 524. The conductive material 528 can provide connectivity between the circuitry side 522 and the side opposite the circuitry side 522 of the package substrate 524.

A base underfill 530 can be used to surround the internal connectors 526 between the active side of the device 502 and the circuitry side 522 of the package substrate 524. The base underfill 530 can cover the active side of the device 502 and space below the active side of the device 502. The base underfill 530 can be applied or cover part or all of the horizontal side 512 and fill the openings 520 of the first surface depression 504.

During fabrication of the present invention, the first surface depression 504 can prevent the base underfill 530 from contacting the stack side 506 of the device 502. An active side of a first component 532 having circuitry, positioned above the device 502 and the base underfill 520, can be connected to the end of the conductors 510 exposed at the stack side 506 of the device 502 using the internal connectors 526. A first underfill 534 can be used to surround the internal connectors 526 between the active side of the first component 532 and the stack side 506 of the device 502.

The first underfill 534 can cover the active side of the first component 532 and the area of the stack side 506 within a perimeter formed by the first surface depression 504. The first underfill 534 can fill space between the area of the stack side 506 within the perimeter formed by the first surface depression 504 and active side of the first component 532.

During the fabrication of the present invention, the stack edge 518 intersecting the vertical side 514 of the first surface depression 504 can be used to confine the first underfill 534 in the area within the perimeter formed by the first surface depression 504.

System connectors 536 can be used to connect the conductive material 528 adjacent the side opposite the circuitry side 522 with a next level of packaging such as a system substrate, a system board, or an integrated circuit packaging assembly. The system connectors 536 can be similar to the internal connectors 526 except the system connectors 536 can be different in size or shape.

An encapsulant 538 can be used to cover or protect the circuitry side 522 of the package substrate 524, the device 502, and the first component 532.

Referring now to FIG. 6, therein is shown a top view of the integrated circuit packaging system 500. For purposes of illustration, a portion of the encapsulant 538 has been removed for clarity. The first component 532 is shown above the base underfill 530 and surrounded by the first underfill 534. The top edge 516 is shown surrounding the first surface depression 504 having a portion of the base underfill 530 over the openings 520.

The base underfill 530 is shown over the circuitry side 522 of the package substrate 524. The integrated circuit packaging system 500 is shown having a square shape. The integrated circuit packaging system 500 can have any shape.

Referring now to FIG. 7, therein is shown a cross-sectional view of a wafer 702 in a planarizing phase of the integrated circuit packaging system 100. The wafer 702 can include device sites 704 having circuitry. Each of the device sites includes an area with vertical conductors 706 similar to the conductors 122 of FIG. 1 except having a greater length. The internal connectors 128 can be attached over an active side of the wafer 702 to providing connectivity with the end of the vertical conductors 706 or circuitry within each of the device sites 704.

A side of the wafer 702, opposite the active side of the wafer 702, can be planarized using a planarization process such as grinding, sanding, cutting, sawing, polishing, or combinations thereof. The planarization process can be used to form the conductors 122 from the vertical conductors 706.

Referring now to FIG. 8, therein is shown the structure of FIG. 7 in a forming phase of the first surface depression 104. The side of the wafer 702, opposite the active side of the wafer 702, can be formed with the first surface depression 104 by using a removal process such as a water-jet guided laser etching, laser grooving, or laser marking.

The first surface depression 104 can optionally be formed using other removal process such as sawing, grinding, cutting, or chemical removal. The first surface depression 104 can surround the conductors 122 within one of the device sites 704.

Referring now to FIG. 9, therein is shown the structure of FIG. 8 in a singulation phase of the wafer 702. Any of the device sites 704 of FIG. 8 can be separated from the wafer 702 using a singulation process such as cutting, sawing, grinding, or any other singulation method. Any of the device sites 704 separated from the wafer 702 can form the device 102 or copies thereof.

Referring now to FIG. 10, therein is shown a portion of the structure of FIG. 9 in a base fill phase. Shown is a substrate board 1002, similar to the package substrate 126 except formed to include several copies of the package substrate 126 joined by the ends together. Each copy of the package substrate 126 used to form the substrate board 1002 can be oriented with matching sides coplanar with one another.

The device 102 can be attached over a portion of the substrate board 1002 having a copy of the package substrate 126 using the internal connectors 128. An area below the device 102 can be filled with the base underfill 132 using a filling process such as a combination of dispensing equipment (not shown) with contact heating, convective heating, or infrared heating.

The base underfill 132 can surround the internal connectors 128 and cover the active side of the device. The first surface depression 104 can prevent any spill over of the base underfill 132 from entering into any area within a perimeter formed by the first surface depression 104.

Referring now to FIG. 11, therein is shown the structure of FIG. 10 in a component fill phase. A component assembly 1102 having the substrate board 1002 is shown with the first component 134 attached over the device 102 using the internal connectors 128. The area within and above the perimeter formed by the first surface depression 104 can be filled with the first underfill 136 using the filling process.

The first underfill 136 can cover the active side of the first component 134 and surround the internal connectors 128 between the first component 134 and the device 102. Edges of the first surface depression 104 parallel with the non-horizontal sides 120 of the device 102 can produce molecular forces such as surface tension and cohesion within the first underfill 136 during the filling process.

The molecular forces combined with monitoring and controlling of the temperature such as cooling rate, heating rate, or gradient rate, can limit the movement of the first underfill 136 away from the internal connectors 128. Furthermore, movement of any underfill such as the first underfill 136 or the base underfill 132 can be prevented from further movement by areas within the first surface depression 104.

Figure 12:
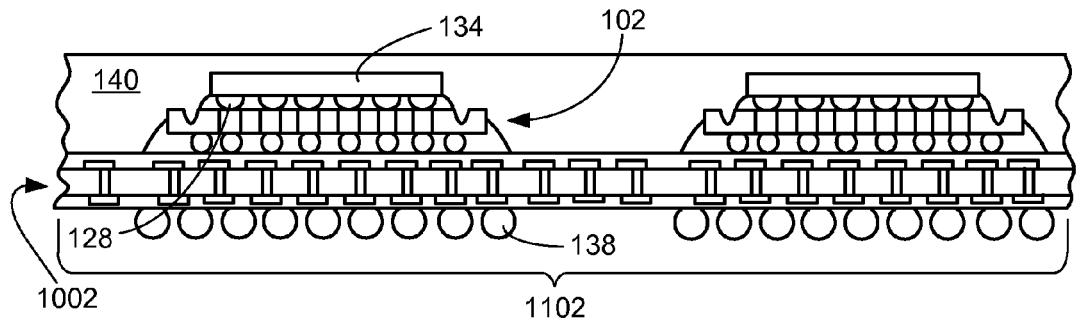
FIG. 12 is the structure of FIG. 11 in a singulation phase.

Referring now to FIG. 12, therein is shown the structure of FIG. 11 in a singulation phase. A side of the substrate board 1002 having circuitry can be encapsulated with the encapsulant 140. The encapsulant 140 can cover the circuitry including the first component 134 and the device 102 above the substrate board 1002 of the component assembly 1102.

The system connectors 138 can be attached to the side of the substrate board 1002 opposite the side covered with the encapsulant 140. The integrated circuit packaging system 100 of FIG. 1 can be formed using a singulation process such as a cutting or a sawing process. The device 102, the first component 134, the system connectors 138, and portions of the encapsulant 140, and portions of the substrate board 1002 connecting to the system connectors 138 are separated from the component assembly 1102.

The separation can be along planes perpendicular with the substrate board 1002 and intersecting the encapsulant 140. The separation results in the formation of the integrated circuit packaging system 100 of FIG. 1.

Figure 13:
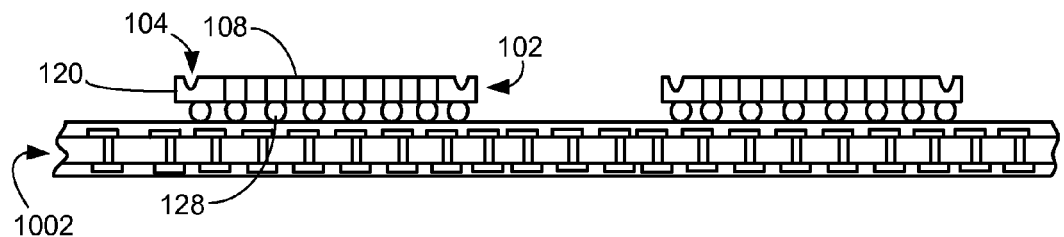
FIG. 13 is the device in a forming phase of the first surface depression of the integrated circuit packaging system.

Referring now to FIG. 13, therein is shown the device 102 in a forming phase of the first surface depression 104 of the integrated circuit packaging system 100. The active side of the device 102 can be mounted over the substrate board 1002 using the internal connectors 128. A laser marking process can be used to form the first surface depression 104 adjacent or in the stack side 108 and along the non-horizontal sides 120 of the device 102.

Figure 14:
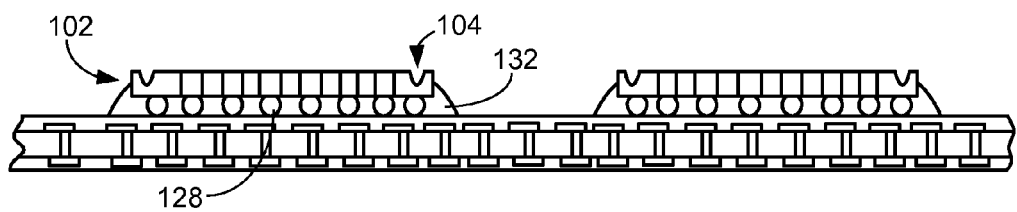
FIG. 14 is the structure of FIG. 13 in a base fill phase.

Referring now to FIG. 14, therein is shown the structure of FIG. 13 in a base fill phase. The area below the device 102 can be filled with the base underfill 132 using the filling process. The base underfill 132 can surround the internal connectors 128 and cover the active side of the device 102 and space below the active side of the device 102. The first surface depression 104 can prevent the base underfill 132 from entering any area within the perimeter formed by the first surface depression 104.

Figure 15:
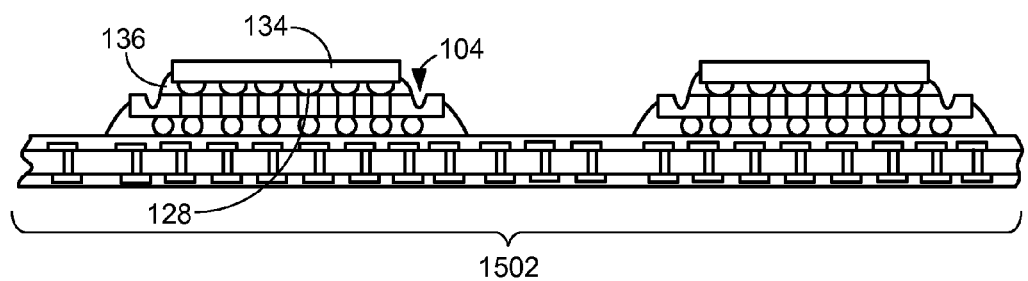
FIG. 15 is the structure of FIG. 14 in a component fill phase.

Referring now to FIG. 15, therein is shown the structure of FIG. 14 in a component fill phase. A component assembly 1502 is shown with the first component 134 attached over the device 102 using the internal connectors 128. The area within and above the perimeter formed by the first surface depression 104 can be filled with the first underfill 136 using the filling process.

The first underfill 136 can cover the active side of the first component 134 and surround the internal connectors 128 between the first component 134 and the device 102. Edges of the first surface depression 104 parallel with the non-horizontal sides 120 of the device 102 can produce molecular forces such as surface tension and cohesion within the first underfill 136 during the filling process.

The molecular forces combined with monitoring and controlling of the temperature such as cooling rate, heating rate, or gradient rate, can limit the movement of the first underfill 136 away from the internal connectors 128. Furthermore, movement of any underfill such as the first underfill 136 or the base underfill 132 can be prevented from further movement by areas within the first surface depression 104.

Figure 16:
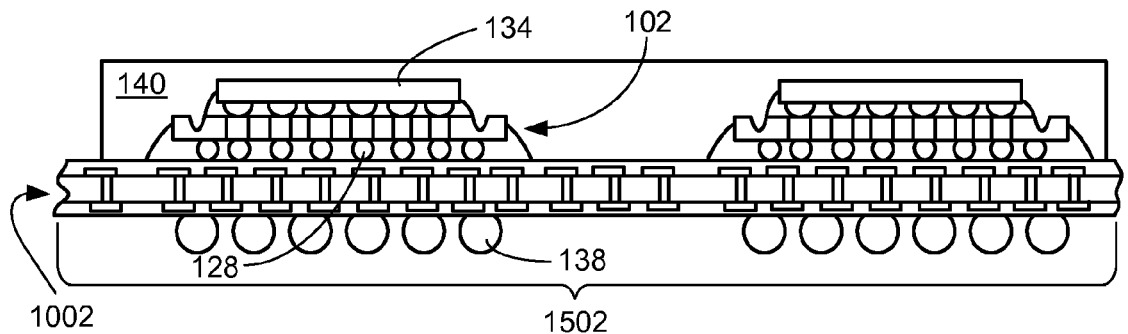
FIG. 16 is the structure of FIG. 15 in a singulation phase.

Referring now to FIG. 16, therein is shown the structure of FIG. 15 in a singulation phase. The side of the substrate board 1002 having the device 102 can be encapsulated with the encapsulant 140. The encapsulant 140 can cover the first component 134 and the device 102 above the substrate board 1002 of the component assembly 1502.

The system connectors 138 can be attached to the side of the substrate board 1002 opposite the side covered with the encapsulant 140. The integrated circuit packaging system 100 of FIG. 1 can be formed using a singulation process such as a cutting or a sawing process. The device 102, the first component 134, the system connectors 138, portions of the encapsulant 140, and portions of the substrate board 1002 connecting to the system connectors 138 are separated from the component assembly 1502.

The separation can be along planes perpendicular with the substrate board 1002 and intersecting the encapsulant 140.

Figure 17:
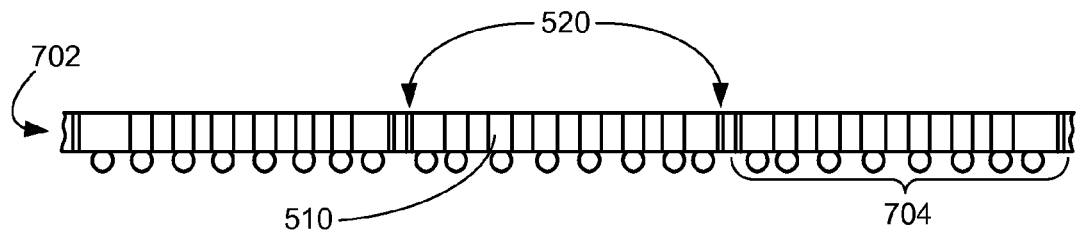
FIG. 17 is the structure of FIG. 7 in a wafer drilling phase of the integrated circuit packaging system.

Referring now to FIG. 17, therein is shown the structure of FIG. 7 in a wafer drilling phase of the integrated circuit packaging system 500. The openings 520 can be formed using a drilling process. The openings 520 can be located around the area having the conductors 510 within each of the device sites 704 of the wafer 702.

Figure 18:
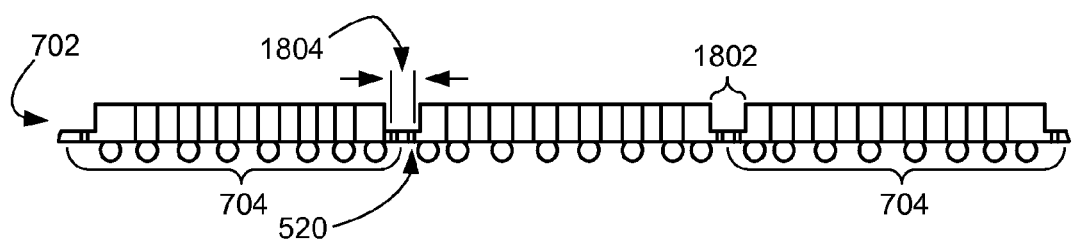
FIG. 18 is the structure of FIG. 17 in a first wafer cutting phase.

Referring now to FIG. 18, therein is shown the structure of FIG. 17 in a first wafer cutting phase. A wide shallow cut 1802, such as such as a surface ditch, a surface groove, a surface channel, or similar surface indentation, can be formed using a cutting process such as a sawing or grinding process. The wide shallow cut 1802, penetrating over half the thickness of the wafer 702, can be located over lines separating the device sites 704 and above adjacent pairs of the openings 520 along the lines. The width of the wide shallow cut 1802 can be wider than an aggregate width 1804 of the adjacent pairs of the openings 520 along the lines.

Figure 19:
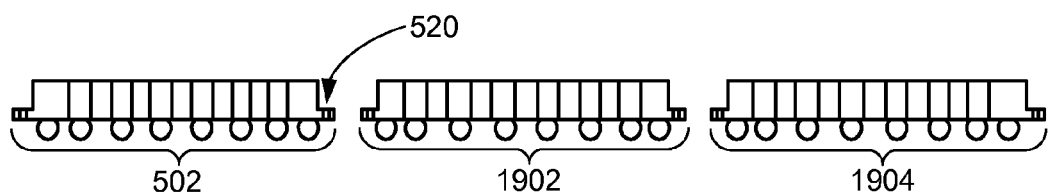
FIG. 19 is the structure of FIG. 18 in a second wafer cutting phase.

Referring now to FIG. 19, therein is shown the structure of FIG. 18 in a second wafer cutting phase. The lines separating the device sites 704 of FIG. 18 can be cut using a second wafer cutting process such as a sawing process. The cut separates the openings 520 along a side of the lines from the openings 520 and along a side opposite the lines.

Each of the device sites 704 can be separated to form the device 502, a first base device 1902, and a second base device 1904. The first base device 1902 or the second base device 1904 can be identical to the device 502.

Figure 20:
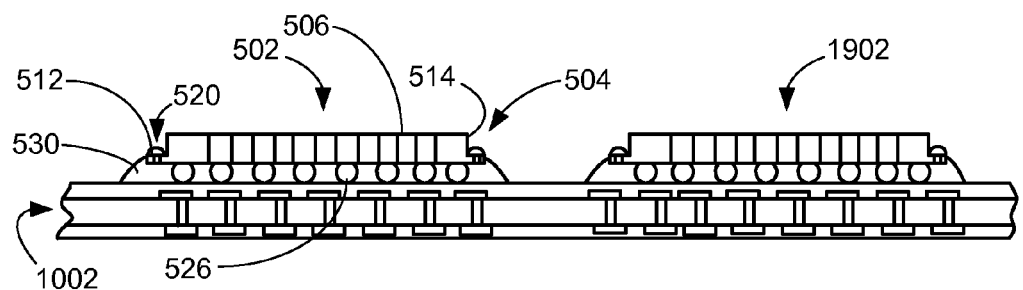
FIG. 20 a portion of the structure of FIG. 19 in a base fill phase.

Referring now to FIG. 20, therein is shown a portion of the structure of FIG. 19 in a base fill phase. The device 502 and the first base device 1902 adjacent the device 502 can be connected over a side of the substrate board 1002 using the internal connectors 526. The internal connectors 526 between the active side of the device 502 and the substrate board 1002 can be surrounded with the base underfill 530 using the filling process.

The base underfill 530 can cover the active side of the device 502 and space between the active side of the device 502 and the substrate board 1002. The base underfill 530 can cover the horizontal side 512 and fill the openings 520 of the first surface depression 504. The first surface depression 504 can prevent the base underfill 530 from contacting the stack side 506 of the device 502 during the filling process.

Figure 21:
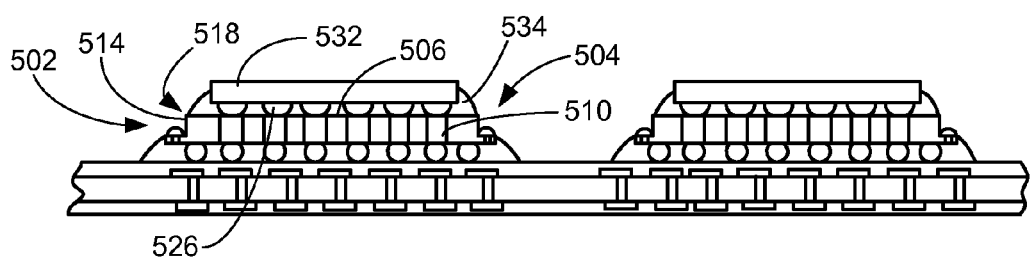
FIG. 21 is the structure of FIG. 20 in a component fill phase.

Referring now to FIG. 21, therein is shown the structure of FIG. 20 in a component fill phase. The active side of the first component 532 can be connected to the end of the conductors 510 exposed at the stack side 506 of the device 502 using the internal connectors 526. The area within and above the perimeter formed by the first surface depression 504 can be filled with the first underfill 534 using the filling process.

The first underfill 534 can cover the active side of the first component 532 and surround the internal connectors 128 between the first component 532 and the device 502. During the filling process, the stack edge 518 intersecting the vertical side 514 of the first surface depression 504 can confine the first underfill 534 in the area within the perimeter formed by the first surface depression 504.

Figure 22:
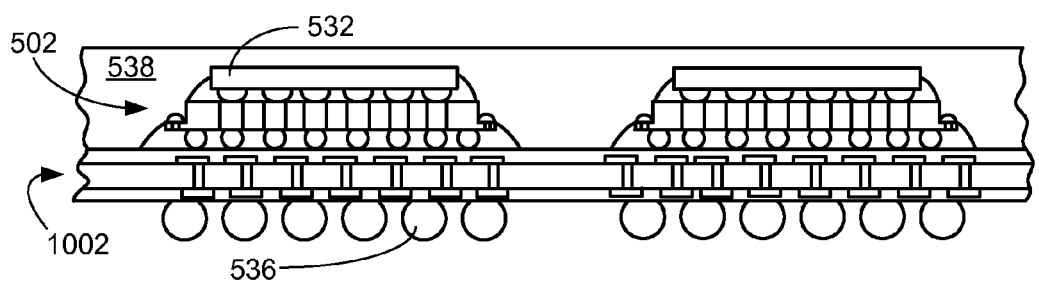
FIG. 22 is the structure of FIG. 21 in a singulation phase.

Referring now to FIG. 22, therein is shown structure of FIG. 21 in a singulation phase. The side of the substrate board 1002 having the device 502 can be encapsulated with the encapsulant 538. The encapsulant 538 can cover the first component 532 and the device 502 above the substrate board 1002.

The system connectors 536 can be attached to the side of the substrate board 1002 opposite the side covered with the encapsulant 538. The integrated circuit packaging system 500 of FIG. 5 can be formed using a singulation process such as a cutting or a sawing process. The device 502, the first component 532, the system connectors 536, and portions of the encapsulant 538, and portions of the substrate board 1002 connecting to the system connectors 536 are separated.

The separation can be along planes perpendicular with the substrate board 1002 and intersecting the encapsulant 538.

Figure 23:
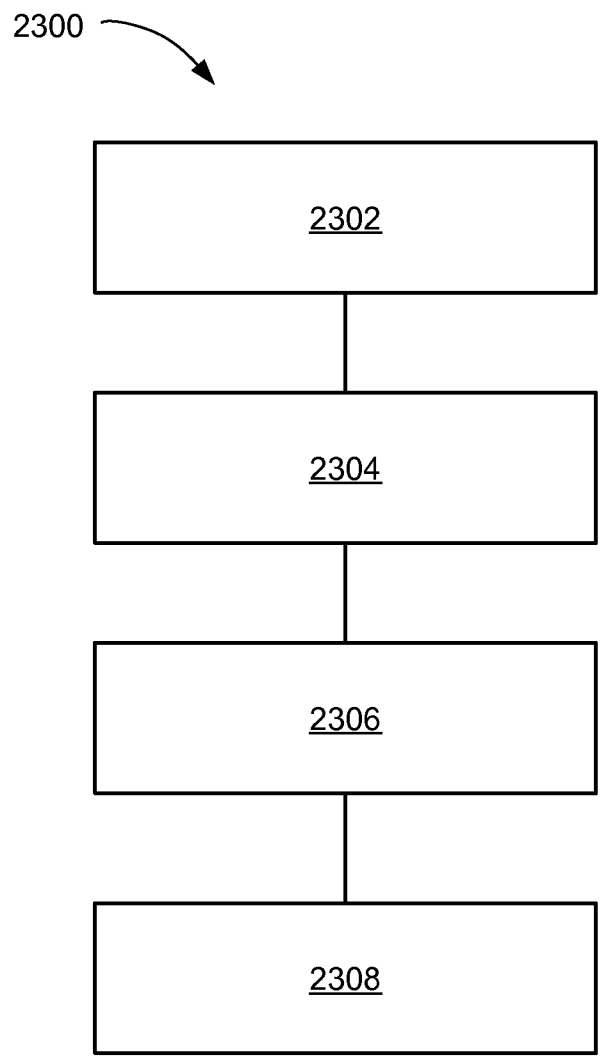
FIG. 23 is flow chart of a method of manufacture of an integrated circuit packaging system in a further embodiment of the present invention.

Referring now to FIG. 23, therein is shown a flow chart of a method 2300 of manufacture of an integrated circuit packaging system 100 in a further embodiment of the present invention. The method 2300 includes providing a device having a conductor with ends exposed on opposite sides of the device in a block 2302; forming a first surface depression on the device around the conductor in a block 2304; connecting a first component over the conductor and surrounded by the first surface depression in a block 2306; and applying a first underfill between the first component and the device, the first underfill substantially filled within a perimeter of the first surface depression in a block 2308.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or

What is claimed is:

1. A method of manufacture of an integrated circuit packaging system comprising:
providing a device formed as a die having a stack side, an active side opposite and facing away from the stack side, and a conductor with an end exposed at the stack side and an opposite end of the conductor exposed at the active side;
forming a first surface depression on the device, the first surface depression surrounding the conductor exposed at the stack side and the active side;
connecting a first component over the conductor and surrounded by the first surface depression; and
applying a first underfill between and in direct contact with the first component and the device, the first underfill substantially filled to a side of an inner edge and within a perimeter of the first surface depression isolated from the conductor; wherein: forming the first surface depression includes an opening within the first surface depression; and further comprising: applying a base underfill within a portion of the opening.

2. The method as claimed in claim 1 further comprising:
providing a second conductor;
forming a second surface depression around the second conductor;
connecting a second component over the second conductor surrounded by the second surface depression; and
applying a second underfill between the second component and the device, the second underfill substantially filling a perimeter of the second surface depression.

3. The method as claimed in claim 1 wherein forming the first surface depression includes forming the first surface depression having a horizontal side and a vertical side.

4. The method as claimed in claim 1 further comprising a base underfill under the first component and covering a portion of the first surface depression.

5. A method of manufacture of an integrated circuit packaging system comprising:
providing a device formed as a die having a stack side, an active side opposite and facing away from the stack side, and a conductor with an end exposed at the stack side and an opposite end of the conductor exposed at the active side;
forming a first surface depression on the device, the first surface depression surrounding the conductor exposed at the stack side and the active side;
connecting a first component over the end of the conductor exposed at the stack side and surrounded by the first surface depression;
applying a first underfill between and in direct contact with the first component and the stack side, the first underfill substantially filled to a side of and within an inner edge and a perimeter of the first surface depression isolated from the conductor;
connecting a package substrate below the device; and
applying a base underfill between the device and the package substrate, the base underfill substantially outside a perimeter of the first surface depression; wherein: forming the first surface depression includes an opening within the first surface depression; and filling the opening with the base underfill.

6. The method as claimed in claim 5 further comprising:
providing a second conductor with ends exposed at opposite sides of the device;
forming a second surface depression next to the first surface depression and around the second conductor;
connecting a second component over the end of the second conductor and surrounded by the second surface depression; and
applying a second underfill between the second component and the stack side.

7. The method as claimed in claim 5 wherein forming the first surface depression includes forming the first surface depression having a horizontal side, a vertical side, and an opening through the horizontal side.

8. The method as claimed in claim 5 wherein applying the base underfill can cover a portion of a horizontal side of the first surface depression.

9. An integrated circuit packaging system comprising:
a device formed as a die having a stack side, an active side opposite and facing away from the stack side, and a conductor with an end exposed at the stack side and an opposite end of the conductor exposed at the active side;
a first surface depression formed on the device, the first surface depression surrounding the conductor exposed at the stack side and the active side;
a first component connected over the conductor surrounded by the first surface depression; and
a first underfill between and in direct contact with the first component and the device, the first underfill substantially filled to an inner edge and within a perimeter of the first surface depression isolated from the conductor; wherein: the first surface depression formed with an opening within the first surface depression; and further comprising: a base underfill applied within a portion of the opening.

10. The system as claimed in claim 9 further comprising:
a second conductor;
a second surface depression formed around the second conductor;
a second component connected over the second conductor surrounded by the second surface depression; and
a second underfill between the second component and the device and a perimeter of the second surface depression substantially filled with the second underfill.

11. The system as claimed in claim 9 wherein the first surface depression formed with a horizontal side and a vertical side.

12. The system as claimed in claim 9 further comprising a base underfill under the first component, the base underfill covers a portion of the first surface depression.

13. The system as claimed in claim 9 wherein:
the first component connected over the end of the conductor at the stack side and surrounded by the first surface depression;
the first underfill between the first component and the stack side; and
further comprising:
a package substrate connected below the device; and
a base underfill between the device and the package substrate and substantially outside a perimeter of the first surface depression.

14. The system as claimed in claim 13 further comprising:
a second conductor with ends at opposite sides of the device;
a second surface depression formed next to the first surface depression and around the second conductor;
a second component connected over the end of the second conductor and surrounded by the second surface depression; and a second underfill between the second component and the stack side.

15. The system as claimed in claim 13 wherein the first surface depression formed having a horizontal side, a vertical side, and an opening through the horizontal side.

16. The system as claimed in claim 13 wherein the base underfill can cover a portion of a horizontal side of the first surface depression.

* * * * *